United States Patent
Segal et al.

(10) Patent No.: US 7,767,043 B2
(45) Date of Patent: Aug. 3, 2010

(54) COPPER SPUTTERING TARGETS AND METHODS OF FORMING COPPER SPUTTERING TARGETS

(75) Inventors: Vladimir M. Segal, Howell, MI (US); Wuwen Yi, Veradale, WA (US); Stephane Ferrasse, Veradale, WA (US); Chi tse Wu, Veradale, WA (US); Susan D. Strothers, Spokane, WA (US); Frank A. Alford, Veradale, WA (US); William B. Willett, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 122 days.

(21) Appl. No.: 12/235,427

(22) Filed: Sep. 22, 2008

(65) Prior Publication Data

US 2010/0059147 A9    Mar. 11, 2010

Related U.S. Application Data

(60) Division of application No. 10/614,807, filed on Jul. 9, 2003, now abandoned, which is a continuation-in-part of application No. 09/465,492, filed on Dec. 16, 1999, now Pat. No. 6,878,250.

(51) Int. Cl.
  *B22D 17/00* (2006.01)
  *C22F 1/08* (2006.01)
  *C22C 14/00* (2006.01)

(52) U.S. Cl. .................. 148/528; 148/536; 148/538; 148/554; 148/557

(58) Field of Classification Search ............. 148/538, 148/554, 557
See application file for complete search history.

(56) References Cited

U.S. PATENT DOCUMENTS

| 6,113,761 | A   | 9/2000  | Kardokus |
| 6,139,701 | A   | 10/2000 | Pavate |
| 6,331,234 | B1  | 12/2001 | Kardokus |
| 6,391,163 | B1  | 5/2002  | Pavate |
| 6,478,902 | B2  | 11/2002 | Koenigsmann |
| 6,723,187 | B2* | 4/2004  | Segal et al. .................. 148/538 |
| 6,797,079 | B2  | 9/2004  | Nagano |

FOREIGN PATENT DOCUMENTS

| EP | 1036859 A1 | 9/2000 |
| WO | 02/36847 A2 | 5/2002 |

* cited by examiner

*Primary Examiner*—George Wyszomierski
*Assistant Examiner*—Weiping Zhu

(57) ABSTRACT

The invention includes a copper-comprising sputtering target. The target is monolithic or bonded and contains at least 99.99% copper by weight and has an average grain size of from 1 micron to 50 microns. The copper-comprising target has a yield strength of greater than or equal to about 15 ksi and a Brinell hardness (HB) of greater than about 40. The invention includes copper alloy monolithic and bonded sputtering targets consisting essentially of less than or equal to about 99.99% copper by weight and a total amount of alloying element(s) of at least 100 ppm and less than 10% by weight. The targets have an average grain size of from less than 1 micron to 50 microns and have a grain size non-uniformity of less than about 15% standard deviation (1-sigma) throughout the target. The invention additionally includes methods of producing bonded and monolithic copper and copper alloy targets.

31 Claims, 7 Drawing Sheets

Boundry levels: 15.0° 5.0°
IPF Map [001]

35.00 μm = 35 steps

Boundry levels: 15.0° 5.0°
IPF Map [001]

1.25 μm= 25 Steps

Boundry levels: 15.0° 5.0°
IPF map [001]
12.50 μm = 25 steps

400X

US 7,767,043 B2

COPPER SPUTTERING TARGETS AND METHODS OF FORMING COPPER SPUTTERING TARGETS

RELATED PATENT DATA

This application is a divisional of application Ser. No. 10/614,807, filed Jul. 9, 2003, now abandoned which is a CIP of Ser. No. 09/465,492, filed Dec. 16, 1999 now U.S. Pat. No. 6,878,250 and patented Apr. 12, 2005 and which are incorporated herein by reference in their entirety.

TECHNICAL FIELD

The invention pertains to copper-comprising monolithic sputtering targets and copper-comprising bonded sputtering targets. The invention additionally pertains to methods of forming copper-comprising monolithic and bonded sputtering targets.

BACKGROUND OF THE INVENTION

High-purity copper sputtering targets and copper alloy sputtering targets are currently used in a variety of applications including, for example, fabrication of integrated circuits. The quality of copper-comprising structures such as interconnects and thin films can depend upon sputtering performance of the target. Various factors of a sputtering target can influence the target's sputtering performance including: average grain size and grain size uniformity of the target material; crystallographic orientation/texture of the target material; structural and compositional homogeneity within the target; and the strength of the target material. Typically, a smaller average grain size is associated with an increased strength of material. Additionally, the amount of alloying can affect strength and hardness of target materials, with increased alloying typically resulting in increased target strength.

Due to the low strength of high-purity copper (greater than 99.99% copper by weight) conventional high-purity copper sputtering targets are typically formed as bonded targets. A bonded copper sputtering target can have a high-purity copper target bonded to a backing plate comprising a relatively high strength material such as, for example, aluminum. However, the high temperatures utilized during bonding of the copper target to the backing plate often results in abnormal grain growth resulting in non-uniformity of microstructure and an increase in overall average grain size. Conventional high-purity copper targets typically have an average grain size greater than 50 microns which can result in relatively low yield strength. The resulting grain size and structural non-uniformity of conventionally formed high-purity copper sputtering targets can detrimentally affect the quality of sputter-deposited high-purity copper films and interconnects.

In addition to the resulting large grain size and anomalous grain growth that can result during bonding processes, diffusion bonded copper targets are often plagued by problems such as burn through and short target life. Additionally, bonding processes can be complicated and time consuming.

One approach to increasing grain size uniformity and enhancing strength of copper materials for sputtering target purposes is to alloy the copper with one or more "alloying" elements. However, since the presence of alloying elements affects the resistivity of copper, it can be desirable to limit the total amount of alloying elements within a target material to no greater than 10 percent by weight. For particular applications such as copper thin films and interconnects, where a resistivity comparable to that of high-purity copper is desired, the amount of alloying should be limited to less than or equal to 3% by weight. Another draw back to alloying can be potential defects such as formation of second phase precipitates or segregation.

Although treatment of conventional materials for reduction or removal of precipitates or segregation defects may be possible in some instances, such treatment typically includes high temperatures which can result in extremely large grain sizes (greater than 150 microns). Alternatively, a partial reduction of second phase precipitates or segregation defects present in conventional materials can be obtained in some instances utilizing conventional rolling and/or forging techniques. However, the remaining defects can still affect the quality of sputtered films. Currently, conventional processing to form copper alloys having less than or equal to 3% by weight of alloying elements result in targets typically having an average grain size of over 30 microns, commonly over 50 microns, and having second phase precipitates therein.

It is desirable to develop methods to produce copper sputtering targets and copper alloy sputtering targets having improved sputtering performance.

SUMMARY OF THE INVENTION

In one aspect the invention encompasses a copper-comprising sputtering target. The target contains at least 99.99% copper by weight and has an average grain size of from 1 micron to 50 microns. The copper-comprising target has a yield strength of greater than or equal to about 15 ksi and a Brinell hardness (HB) of greater than about 40.

In one aspect the invention encompasses a copper alloy sputtering target consisting essentially of less than or equal to about 99.99% copper by weight and at least one alloying element selected from the group consisting of Cd, Ca, Au, Ag, Be, Li, Mg, Al, Pd, Hg, Ni, In, Zn, B, Ga, Mn, Sn, Ge, W, Cr, O, Sb, Ir, P, As, Co, Te, Fe, S, Ti, Zr, Sc, Si, Mo, Pt, Nb, Re and Hf. The target has a total amount of alloying elements of at least 100 ppm and less than 10% by weight. The target also has an average grain size of from 1 micron to 50 microns and a grain size uniformity having a standard deviation throughout the target of less than about 15% of 1-sigma.

In one aspect the invention encompasses a method of forming a monolithic sputtering target. A copper billet consisting essentially of copper and less than or equal to 10% by weight of a total amount of one or more alloying elements is heated to a temperature of at least about 900° F. and maintained at that temperature for at least about 45 minutes. The billet is hot forged with a reduction in height of at least about 50% to form a forged block and the block is cold rolled to a reduction of at least about 60% to form a blank. The blank is heated to induce recrystallization and to form a fine grain distribution having an average grain size less than about 100 microns. The blank is subsequently formed into a monolithic target shape.

In one aspect the invention encompasses a method of forming a copper-comprising sputtering target from a copper-billet having a purity of at least 99.99% copper. The billet is hot forged at a temperature of greater than 300° C. with a reduction in height of at least 40% to form a forged block. The forged block is water quenched and subjected to an extrusion process comprising at least 4 passes of the forged block through equal channel angular extrusion (ECAE). An optional solutionizing process can be conducted after the forging, followed by water quenching and the ECAE. Intermediate annealing is performed between at least some of the ECAE passes and, after completion of ECAE processing the block is cold rolled to a reduction of less than 90% to form a blank. The blank can be heat treated and subsequently formed into a sputtering target.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
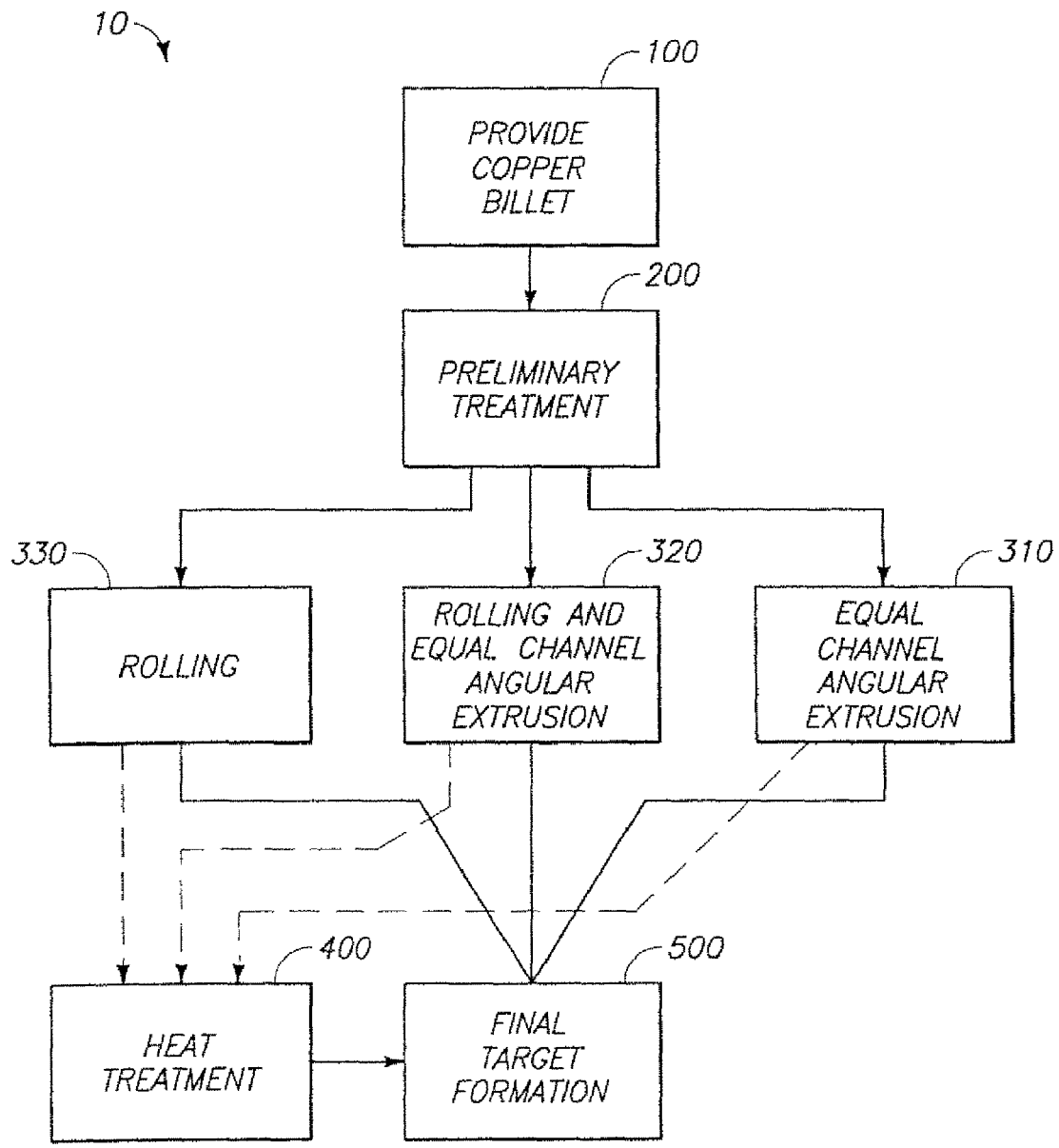
FIG. 1 is a flowchart diagram depicting a general overview of processing methods according to one aspect of the present invention.

This disclosure of the invention is submitted in furtherance of the constitutional purposes of the U.S. Patent Laws "to promote the progress of science and useful arts" (Article 1, Section 8).

The invention encompasses monolithic high-purity copper sputtering targets, bonded high-purity copper sputtering targets, monolithic copper alloy sputtering targets bonded copper alloy sputtering targets, and methods of producing such targets. For purposes of the present description, high-purity copper can refer to copper or a copper material having at least 99.99% copper by weight. The invention encompasses high-purity targets having from at least 99.99% to 99.99995% copper by weight. Additionally, the use of the term "monolithic" refers to a target that is utilized for sputtering without being bonded to a backing plate.

Bonded or monolithic high-purity targets according to the invention can have an average grain sizes of from less than 1 micron to less than or equal to about 100 microns, preferably less than 50 microns. In some instances, methods of the invention can be utilized to produce monolithic or bonded targets having an average grain size of from 1 to about 30 microns. Monolithic and bonded targets of high-purity copper according to the invention can, in particular instances, preferably have an average grain size of from 1 micron to about 20 microns, such as for example, from about 5 microns to about 10 microns.

High-purity targets of the invention can have a grain size uniformity across a sputtering surface of the target and/or throughout the entire target, the uniformity of grain size being such that a standard deviation (1-sigma) less than or equal to about 15% (also referred to as less than 15% non-uniformity). In particular instances the uniformity can reflect a standard deviation of less than or equal to 10% (1-sigma).

High-purity copper sputtering targets of the invention can have a yield strength that is at least about 10% greater than a target having a substantially identical elemental composition with an average grain size of 50 microns, and in some instances at least 10% greater than a target having a substantially identical elemental composition with an average grain size of 30 microns. For purposes of the present description the phrase "substantially identical elemental composition" can refer to a material having no detectable composition differences. The yield strength imparted to targets by the methods described below can typically be greater than or equal to about 15 ksi.

The high-purity copper targets of the invention can have an ultimate tensile strength of at least 15% greater than a target having a substantially identical elemental composition with an average grain size of 50 microns, and in some instances the ultimate tensile strength can be at least 15% greater than a target having a substantially identical elemental composition with an average grain size of 30 microns. Additionally, the hardness of the high-purity copper targets can be at least 15% greater than a target having a substantially identical elemental composition with an average grain size of 30 microns. In particular instances, high-purity targets of the invention can have a Brinell hardness of greater than about 40 HB, and in particular instances greater than about 60 HB.

In particular aspects, the high-purity copper sputtering targets of the invention can have a purity of 99.99% (4N) or greater. For purposes of the present description, all percentages and included amounts are by weight unless specifically indicated otherwise. In some aspects the high-purity target can preferably comprise 99.999% (5N) copper, can preferably comprise 99.9999% (6N) copper, or can preferably comprise 99.99995% (6N5) copper.

Bonded high-purity copper targets of the present invention can comprise the high-purity copper target diffusion bonded to a backing plate. In particular instances the bonded target can have a diffusion bond yield strength of greater than 10 ksi, preferably greater than or equal to about 15 ksi, and in particular instances can have a bond yield strength greater than or equal to about 30 ksi. Alternatively, the target can be bonded to a backing plate utilizing an alternative bonding method comprising, for example, one or more of hipping, roll cladding, soldering, explosive bonding, and frictionless forging. The alternative bonding method can preferably bond the high-purity copper target to the backing plate to produce a bond having a yield strength of greater than or equal to about 10 ksi.

A backing plate for utilization in bonded targets of the present invention can preferably be an aluminum or CuCr backing plate. As will be understood by those skilled in the art, alternative backing plate materials may also be utilized as appropriate.

The invention encompasses copper alloy sputtering targets that comprise less than or equal to about 99.99% copper by weight. Preferably, the copper alloy sputtering targets of the invention can consist essentially of less than or equal to about 99.99% copper by weight and at least one alloying element selected from the group consisting of Cd, Ca, Au, Ag, Be, Li, Mg, Al, Pd, Hg, Ni, In, Zn, B, Ga, Mn, Sn, Ge, W, Cr, O, Sb, Ir, P, As, Co, Te, Fe, S, Ti, Zr, Sc, Si, Pt, Nb, Re, Mo, and Hf. In particular instances, the at least one alloying element can preferably be selected from Ag, Al, In, Zn, B, Ga, Mg, Sn, Ge, Ti and Zr. A total amount of the at least one alloying element present in the target can preferably be from at least about 100 ppm by weight to less than about 10% by weight. In some instances, the at least one alloying element can preferably be present at from at least 1000 ppm to less than about 3%, more less than about 2%, by weight.

Copper alloy sputtering targets according to the invention can, in particular aspects, have an average grain size of less than 1 micron. Alternatively, the copper alloy sputtering target can comprise an average grain size of from 1 micron to about 100 microns, preferably less than 50 microns. In some aspects, the copper alloy target can preferably have a grain size of from 1 to 30 microns. Applications of the methods of the invention can, in some instances produce the target to have an average grain size of less than or equal to 20 microns, and in particular aspects from about 5 microns to about 10 microns. Additionally, copper alloy targets of the invention can have a grain size uniformity throughout the target and or across the sputtering surface of the target. In particular aspects, the average grain size throughout the target can have a grain size non-uniformity of less than 15% (referring to a standard deviation (1-sigma) in grain size of less than or equal to about 15%, and in particular instances can have a standard deviation (1-sigma) of less than or equal to about 10% (non-uniformity of less than or equal to 10%).

Copper alloy sputtering targets according to the invention can have a Brinell hardness of at least about 40 HB. In some instances, targets of the invention can have a hardness of greater than or equal to about 60 HB. Additionally, the copper alloy targets can have a hardness uniformity across a sputtering surface and/or throughout the target. For example, in particular instances the hardness throughout a copper alloy target can have a standard deviation (1-sigma) of less than about 5% (in other words, the target can have a non-uniformity of less than 5%). In particular instances, the hardness uniformity can have a standard deviation of less than about 3.5% (1-sigma).

Copper alloy targets of the invention can be monolithic or in alternative embodiments can be bonded, Bonded copper alloy targets of the invention can be bonded to a backing plate by diffusion bonding or alternatively by a method utilizing one or more of hipping, roll cladding, soldering, explosive bonding, frictionless forging and other appropriate bonding techniques. Where the copper alloy target is bonded, the bond can have a bond yield strength of greater than about 10 ksi and preferably greater than about 15 ksi.

Processing of copper materials in accordance with methods of the invention can produce copper targets having a texture ranging from extremely weak (close to random) to extremely strong, depending upon the processing routes utilized (discussed below). For purposes of the present description, the term "copper" (as used in the terms "copper target", "copper material", "copper billet", etc.), can generally refer to either a high-purity copper or a copper alloy. An exemplary copper target having a weak texture in accordance with the invention can have a crystal grain orientation distribution function (ODF) of less than or equal to about fifteen times random. In particular instances the target can have an extremely weak texture, characterized by an ODF less than about five times random.

The copper target can comprise a primary grain orientation wherein the term "primary" refers to a grain orientation that is present in the target in greater abundance than any single alternative grain orientation. It is noted that the term "primary" does not necessarily mean that a majority of the grains are present in this orientation. Rather, the term "primary" means that there is no single alternative orientation present in greater abundance within the target. In particular aspects, the methodology of the invention can be utilized to produce targets having a primary grain orientation other than (220).

Alternative processing in accordance with the invention can produce copper targets having a less random texture. The invention encompasses processing which can induce strong textures in the copper articles produced, where the term "strong texture" can refer to a material having an ODF above about 15 times random. Targets of the invention can additionally be produced to have an extremely strong texture characterized by an ODF above 20 times random. In particular instances the targets of the invention can preferably have a predominant grain orientation other than (220).

The size of copper targets produced utilizing methods in accordance with the invention is not limited to particular values. Additionally, the targets can be produced in a variety of shapes such as for example, circular or rectangular. Due to the increased strength of the materials produced by the methods described relative to conventional methods, larger copper target sizes can be produced relative to those produced by conventional methodologies. As discussed above, conventional copper targets are bonded to a backing plate to provide sufficient strength. The high strength of the materials of the invention can be especially advantageous since the increased strength can reduce or prevent warping of the target during fabrication and or sputtering processes. The methodology allows monolithic (non-bonded) copper targets to be utilized and allows larger target sizes for both bonded and monolithic targets. Bonded or monolithic targets of the invention can be produced for a variety of sputtering applications, including but not limited to 200 mm wafer processing and 300 mm wafer processing.

Although the targets and methods of the invention are described with specific reference to copper and copper alloys, it is to be understood that the invention encompasses alternative materials, including high-purity metals and alloy materials. Exemplary alternative materials to which application of the described methodology can be particularly advantageous include aluminum, aluminum alloys, titanium, titanium alloys, tantalum, tantalum alloys, nickel, nickel alloys, molybdenum, molybdenum alloys, gold, gold alloys, silver, silver alloys, platinum and platinum alloys. The listed alloys can preferably comprise less than or equal to 10% alloying element(s), by weight. As will be understood by those skilled in the art, the temperatures and other values indicated for methodology described below with respect to copper materials can be adjusted based upon particular composition to which the methodology will be applied.

Figure 2:
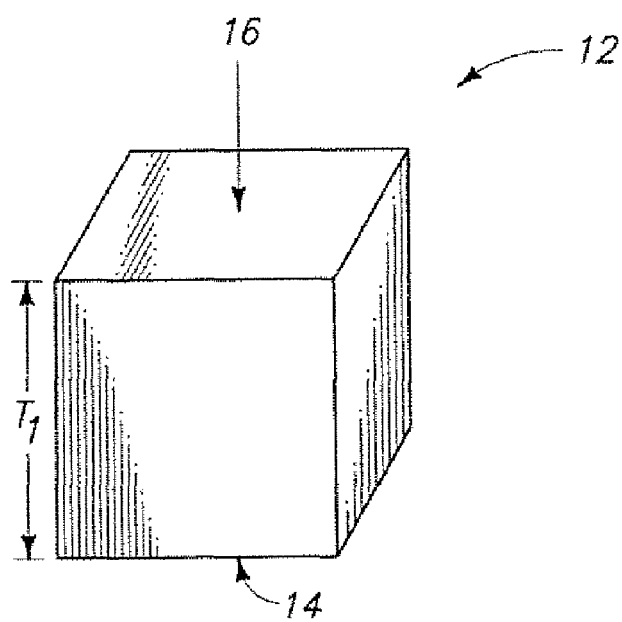
FIG. 2 illustrates a square billet at an initial processing step according to the invention.

Methodology of the invention is described generally with reference to FIG. 1. In an exemplary processing scheme 10 a material to be processed to form a sputtering target is provided in an initial processing step 100. The initial material can be provided in the form of a billet such as the exemplary billet 12 depicted in FIG. 2. Referring to FIG. 2, billet 12 can comprise a lower face 14, an upper face 16 and can comprise a thickness of material between lower face 14 and upper face 16 indicated as $T_1$. Billet 12 can be a square or rectangular shape as indicated in FIG. 2 or alternatively can comprise a cylindrical or other shape (not shown). Billet 12 can preferably comprise a cast material, although alternative billet materials are contemplated. In embodiments where a high-purity target is desired, it can be particularly preferred that billet 12 be a cast material since cast materials can be provided in very pure form. The targets produced by methodology of the invention typically have a composition that is substantially identical to the composition of the billet; where substantially identical refer to materials having no detectable composition differences.

The texture of the material of billet 12 can influence the texture and/or the difficulty in achieving a desired final texture of the article produced in accordance with the invention. Accordingly, billet 12 can be provided to have an initial texture that can favor production of the texture desired in the copper target. It can be advantageous to provide billet 12 having a strong texture where a strong texture is desired in the final article. It is to be noted however, that alternative methodology of the invention can be utilized to produce a weak or extremely weak texture from a billet having a strong texture. Additionally, a billet having a weak texture can be processed in accordance with methodology of the invention to produce a target having a strong or extremely strong texture. A billet having a particular primary or predominant grain orientation can be processed to produce a target having the same or a differing primary of predominant grain orientation, or to having no single predominant grain orientation.

In particular aspects, billet 12 can comprise a high-purity copper material having at least 99.99% copper by weight. In particular applications, billet 12 can consist essentially of copper having a 99.99% purity (4N), having a 99.999% purity (5N), having a 99.9999% purity (6N), or having a purity which exceeds 6N, for example 99.9999% copper by weight. The invention also encompasses processes where billet 12 comprises an alternative high-purity metal such as aluminum, gold, silver, titanium tantalum, nickel, platinum or molybdenum.

Billet 12 can alternatively comprise less than 99.99% copper or less than 99.99% of any of the alternative metals indicated above. For ease of description, billet 12 will henceforth be referred to as a copper billet although it is to be understood that the invention encompasses alternative metals and their alloys. In some aspects of the invention, copper billet 12 can preferably consist essentially of less than 99.99% copper and at least one alloying element selected from the group consisting of Cd, Ca, Au, Ag, Be, Li, Mg, Al, Pd, Hg, Ni, In, Zn, B, Ga, Mn, Sn, Ge, W, Cr, O, Sb, Ir, P, As, Co, Te, Fe, S, Ti, Zr, Sc, Si, Pt, Nb, Re, Mo, and Hf. A total amount of alloying element(s) in the copper billet can preferably be from at least 100 ppm by weight to less than or equal to about 10% by weight. In particular aspects, the copper billet can preferably comprise from at least 1000 ppm to less than or equal to about 3% alloying element(s), or more preferably less than or equal to about 2% total alloying element(s), by weight. In particular embodiments the alloying elements can preferably comprise one or more of Ag, Al, In, Zn, B, Ga, Mg, Sn, Ge, Ti and Zr.

Referring again to FIG. 1, the copper billet provided in step 100 can be subjected to a preliminary treatment 200. Preliminary treatment 200 can comprise at least one of homogenizing, solutionizing and hot forging. As will be understood by those skilled in the art, appropriate temperatures for conducting solutionizing, homogenizing or hot forging can depend upon the specific composition of billet 12. In particular aspects, the invention preferably comprises hot forging during preliminary treatment 200 to form a forged block. Hot forging of copper billet 12 can be conducted a temperature of at least about 300° C., and can preferably be conducted at a temperature of at least about 500° C., The hot forging can preferably reduce the initial thickness of billet 12 ($T_1$ of FIG. 2) at least about 40% and in particular instances preferably at least about 50%.

During the preliminary treatment, hot forging can optionally be preceded by or followed by additional heat treatment which can comprise solutionizing and/or homogenizing of the copper material Heat treatment can be conducted at a temperature sufficient to induce solutionization and/or homogenization to occur in the particular composition being treated. This solutionizing/homogenizing temperature can preferably be maintained for a time sufficient to maximize the solutionization and/or homogenization of the composition. It is to be noted that temperatures sufficient for solutionizing or homogenizing can result in grain growth producing a grain size above the desired range of less than about 100 microns. Accordingly, conventional methods which attempt to achieve smaller grain sizes tend to minimize solutionizing or homogenizing treatments. However, methodology according to the present invention allows post homogenizing/solutionizing reduction in grain size thereby achieving the benefits of both the solutionizing/homogenizing treatment and small grain size. It can be advantageous to solutionize and or homogenize during preliminary treatment step 200 to dissolve any precipitates and/or particles present in the copper billet. Homogenizing can additionally decrease or eliminate chemical segregation within billet 12.

Preliminary treatment processes of the present invention are not limited to particular ordering of homogenizing, solutionizing and/or hot forging treatments. In particular aspects, preliminary treatment 200 can comprise homogenizing of the copper billet followed by hot forging and subsequent solutionizing. In other instances, solutionizing is conducted followed by hot forging. Exemplary preferred preliminary treatments are set forth below in descriptions of exemplary preferred embodiments of the invention.

In some instances where hot forging is conducted during preliminary treatment 200, the preliminary treatment can additionally include quenching following, and preferably immediately following hot forging. Although alternative quenching techniques can be utilized it can be preferable to utilize water quenching.

In particular embodiments, hot forging can comprise an initial heating and one or more subsequent re-heating events may be conducted. The height reduction produced during each forging event between the initial heating and each subsequent re-heating can vary depending on factors such as the particular composition and forging temperature utilized. Any quenching that is conducted can preferably occur only after the final reheating. Exemplary reheating can comprise one or more reheating of the forged block to a temperature of 1400° F. for at least about ten minutes subsequent to the initial hot forging.

In addition to the processes described above, preliminary treatment 200 can optionally comprise aging treatment. Where the preliminary treatment comprises aging, billet 12 is preferably processed into a forged block prior to aging. More preferably, aging can be conducted as the final processing in the pretreatment stage. In particular instances, aging can be utilized to induce formation of fine precipitates within the copper material. Such induced precipitates can have an average diameter of less than about 0.5 microns. In particular applications, it can be advantageous to induce precipitates by aging since such precipitates can promote development of fine and uniform grains during subsequent processing and can stabilize the grain structures so produced.

Figure 3:
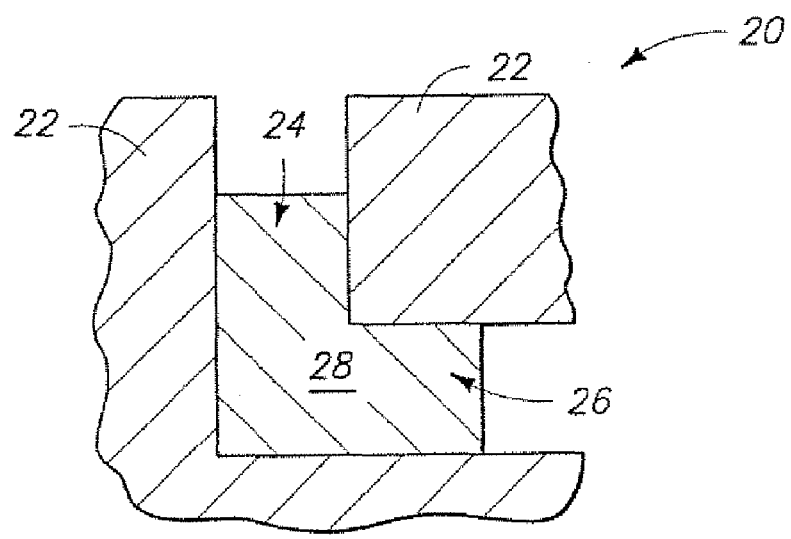
FIG. 3 is a diagrammatic cross-sectional view of a material being treated with an equal channel angular extrusion apparatus.

The hot forged and/or solutionized block formed during preliminary treatment 200 can subsequently undergo alternative processing as shown in FIG. 1. In one aspect, the processed block can be subjected to equal channel angular extrusion (ECAE) processing 310 to form a target blank. Referring to FIG. 3, such illustrates an exemplary ECAE device 20. Device 20 comprises a mold assembly 22 that defines a pair of intersecting channels 24 and 26. Intersecting channels 24 and 26 are identical or at least substantially identical in cross section, with the term "substantially identical" indicating that the channels are identical within acceptable tolerances of an ECAE apparatus. In operation, a billet 28 (which can be the forged block described above) is extruded through channels 24 and 26. Such extrusion results in plastic deformation of the billet by simple shear, layer after layer, in a thin zone located at the crossing plane of the channels. Although it can be preferable that channels 24 and 26 intersect at an angle of about 90%, it is to be understood that an alternative tool angle can be utilized (not shown). A tool angle (channel intersect angle) of about 90° can be preferable since an optimal deformation (true shear strain) can be attained.

ECAE can introduce severe plastic deformation in the forged block material while leaving the dimension of the block unchanged. ECAE can be a preferred method for inducing severe strain in a metallic material in that ECAE can be utilized at low loads and pressures to induce strictly uniform and homogenous straining. Additionally, ECAE can achieve a high deformation per pass (true strain $\epsilon=1.17$); can achieve high accumulated strains with multiple passes through an ECAE device (at N=4 passes, $\epsilon=4.64$); and can be utilized to create various textures/microstructures within materials by utilizing different deformation routes (i.e. by changing an orientation of the forged block between passes through an ECAE device).

In an exemplary method of the present invention, ECAE is conducted at a strain rate and processing temperature sufficient to obtain desired microstructures (for example a weak texture and small grain size) within a copper billet or forged block, and to generate a uniform stress-strain state throughout the billet. The copper material can be passed through an ECAE apparatus several times, and with numerous routes and at a temperature which can correspond to cold or hot processing of the material. A preferred route to utilize with multiple passes through ECAE apparatus 20 can be the "route D", which corresponds to a constant 90° billet rotation before each successive pass. Since the ECAE route can affect structural orientation produced during dynamic recrystallization, one or more particular routes can be chosen for deformation passes to induce a desired orientation in the processed material.

In particular applications, the forged block processed in step 200 is subjected to at least four ECAE passes in process 310. Typically, ECAE processing 310 comprises from four to eight passes, and can preferably comprise from four to six passes. Such exemplary number is generally found sufficient to promote grain refinement to sub-micron size by mechanically induced dynamic recrystallization (where sub-micron refers to an average grain size of less than 1 micron).

Typically, ECAE passes one through three each successively creates defects (micro-bands; shear bands, arrays of dislocations, etc.). During these initial passes, thermodynamic rearrangement can occur creating cells and sub-grains and initiating mis-orientation of grain boundaries. The texture strength of the material prior to ECAE can affect the strength that is produced during the initial three passes, with strong initial textures typically becoming randomized after a greater number of passes relative to materials having a weak initial texture. Subsequent passes (i.e. the fourth pass and any additional passes); create a dynamically recrystallized submicron grain size by inducing an increase in the number of high angle boundaries. During the dynamic recrystallization, the newly created grains gradually acquire a weaker texture and become increasingly equiaxed.

In some applications, heating of ECAE apparatus die can be utilized to heat billet 28 during the ECAE passes. The die can preferably be heated to less than the lowest temperature which can produce static recrystallization of the copper material being processed (alternatively referred to as the minimum recrystallization temperature), and can more preferably be heated to a temperature of from about 125° C. to about 350° C.

During ECAE processing 310, intermediate annealing can optionally be performed between some or all of the ECAE passes. Intermediate annealing can be performed below the beginning temperature of static recrystallization, at or near the beginning temperature of static recrystallization (defined as the lowest temperature which begins to induce recrystallization of the material being processed) or within the range of temperature for full static recrystallization of the composition. The temperature at which the intermediate anneal is conducted can influence the size and orientation of crystal grains and can therefore be utilized to promote a desired texture in a given instance.

Intermediate annealing at temperatures which can produce full static recrystallization can allow increased weakening of textures to occur during subsequent ECAE passes. Annealing at temperatures below the beginning temperature of static recrystallization can produce recovery (stress relief) which can also result in changes in texture strength and orientation. The reorientation effect can be maximal when sub-crystallization temperature annealing is performed between one or more of the initial four passes, and can become less marked when performed between passes subsequent to the fourth pass. Intermediate annealing at the beginning temperature of static recrystallization can result in both change in texture (strength and/or orientation) and some recrystallization. Repeated intermediate annealing between successive passes can have an enhanced effect relative to the effects described for individual annealing events.

In particular applications of the present invention it can be preferable to conduct any intermediate annealing at a temperature and for a time less than those which can result in static recrystallization of the material being processed. It can be advantageous to conduct intermediate annealing at temperatures lower than those which can induce static recrystallization to minimize surface cracking and enhanced microstructural uniformity. Where the forged block being subjected to ECAE comprises high-purity copper, intermediate annealing can preferably be conducted at temperatures of from about 125° C. to about 225° C., and for a time of longer than about 1 hour. This can allow ECAE processing 310 to produce a high-purity copper material having extremely uniform and small grain sizes, for example, averaging from submicron grain sizes to about 20 microns.

In aspects of the invention where the forged block material comprises a copper alloy, sub-crystallization temperature intermediate annealing performed during ECAE processing 310 can preferably comprise temperatures from about 150° C. to about 325° C., such temperature preferably being maintained for at least 1 hour. This sub-recrystallization temperature annealing treatment can produce copper alloy material having an average grain size of less than 1 micron.

Figure 4:
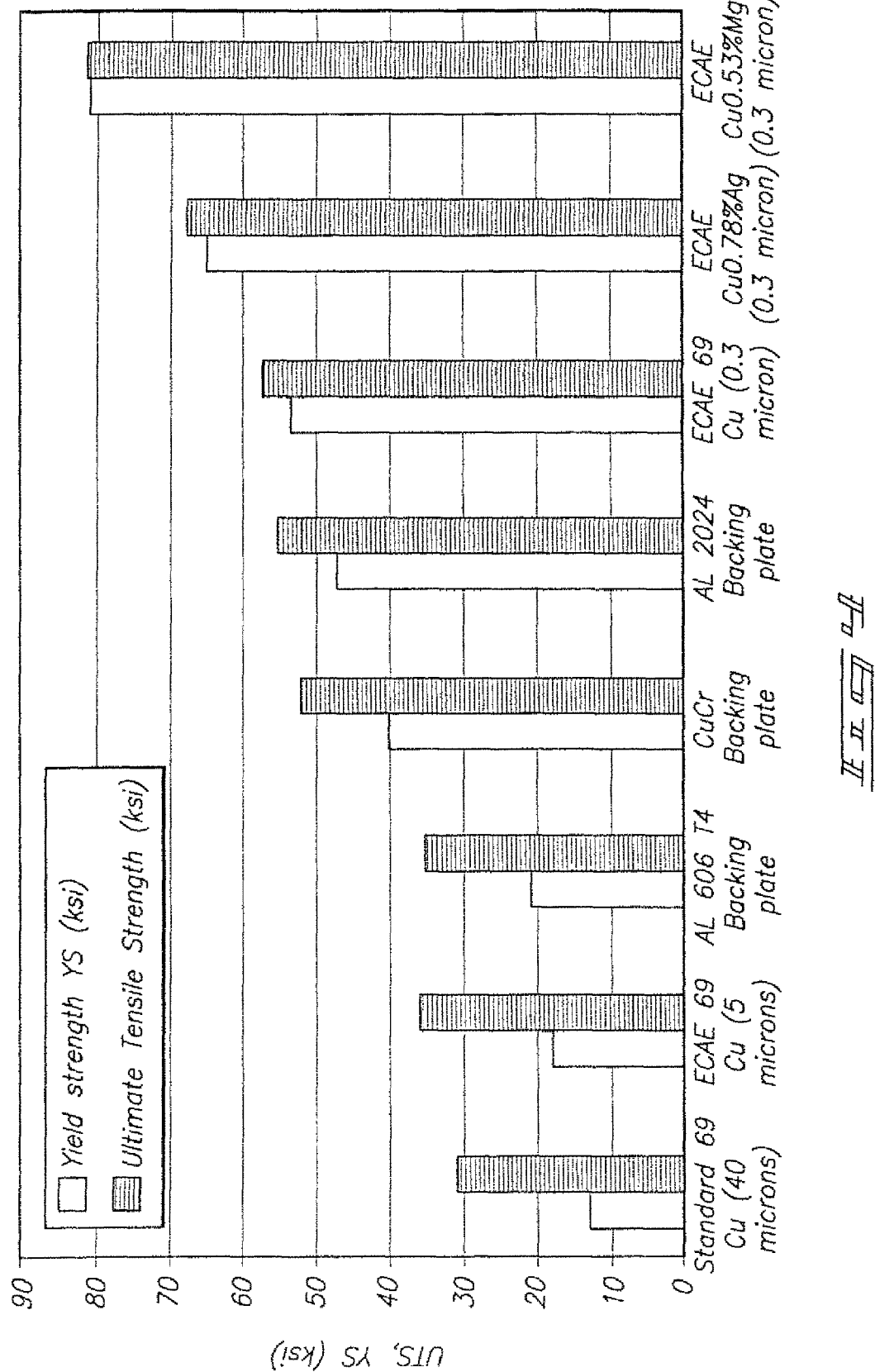
FIG. 4 shows a comparison of yield strength and ultimate tensile strength of various copper and copper alloys processed utilizing equal channel angular extrusion relative to standard 6N copper having a grain size of 40 microns and relative to various backing plates.

The high-purity copper and copper alloy materials produced by the ECAE methods described above can have an improved hardness relative to materials produced by conventional processing techniques. The resulting hardness for 6N copper and various copper alloys processed in accordance with the methodology of the invention relative to the corresponding materials prior to ECAE are indicated in Table 1. FIG. 4 compares the yield strengths and ultimate tensile strengths for high-purity copper and various copper alloys processed in accordance with methodology of the invention, relative to 6N copper having a grain size of 40 microns and relative to various baking plate materials.

TABLE 1

Effects of ECAE treatment on material grain size and hardness

| Pre-ECAE Material (grain size 30-50 μm) | Hardness (Vickers) | Post-ECAE average grain size | Post-ECAE Hardness (Vickers) | Increase in Hardness |
|---|---|---|---|---|
| 6N Copper | 48.44 HV | 5 μm | 72.2 HV | 49% |
| 6N Cu + 0.8% Ag | 73.02 HV | 4 μm | 89.88 HV | 23% |
| 6N Cu + 0.8% Ag | 73.02 HV | 0.35 μm | 172.4 HV | 136% |
| 6N Cu + 0.5% Sn | 75 HV | 4 μm | 104.56 HV | 39.4% |
| 6N Cu + 0.5% Sn | 75 HV | 0.35 μm | 182 HV | 142% |

After preliminary treatment 200, copper materials can undergo an alternative processing route 330 comprising a rolling process to produce the target blank, as shown in FIG. 1. Rolling treatment 330 preferably comprises subjecting the forged block produced by preliminary treatment 220 to cold rolling with a total reduction of at least 60% and preferably from 60% to 85%. The cold rolling can comprise greater than four passes, preferably greater than eight passes and more preferably from eight to sixteen passes. During the overall rolling process, each of an initial four passes is preferably conducted to reduce the thickness of the block by from about 5% to about 6% for each pass. Additionally it can be preferable that a final four of the rolling passes each produce reduction of thickness of from about 10% to about 20%. The relatively small reductions during the initial four passes can alleviate or prevent cracking during the rolling process. The rolling can produce a small grain size in the resulting cold rolled high-purity copper or copper alloy material.

Alternative to the processing route above, processing route 320 can be conducted as shown in FIG. 1. Route 320 utilizes a combination of cold rolling and equal channel angular extrusion techniques. In aspects of the invention where processing alternative 320 is utilized, it can be preferable to subject the hot forged block produced by preliminary treatment 200 to ECAE and a subsequent cold rolling treatment. It is to be understood however, that the invention contemplates performing cold rolling prior to ECAE, or both prior to and subsequent to ECAE.

The ECAE portion of process 320 can comprise the ECAE processing methods described above. The ECAE extruded material can subsequently be cold rolled to a reduction of less than about 90% to form a blank. In particular instances, the cold rolling portion of route 320 can preferably produce a reduction of at least about 60%. The cold rolling processing of ECAE extruded material can comprise the rolling process described above with respect to rolling processing 330. In particular aspects, route 320 can combine the rolling with forging to produce the total reduction of at least 60% and less than 90%. Alternatively, a forging process can be utilized in an absence of rolling to produce the desired reduction of from 60% to 90%.

It can be advantageous to combine ECAE with a subsequent rolling and/or forging process since such processing can induce a desired grain orientation into the copper material. The induced orientation can comprise a primary grain orientation or can comprise a predominant grain orientation. Rolling and/or forging can be used to create strong or extremely strong textures within the copper articles of the invention. In some aspects, the strong textures created by the post-ECAE rolling/forging will be other than (220) texture.

The resulting blank comprising copper or copper alloy material can undergo a final target formation processing 500 and can optionally undergo an additional heat treatment 400 prior to the final target formation 500 as shown in FIG. 1. Optional heat treatment process 400 can comprise conducting an annealing treatment at a temperature and time less than those that can induce onset of static recrystallization. The low temperature anneal also referred to as recovery anneal, is conducted below the minimum temperature of static recrystallization. Recovery annealing or optional absence of anneal can be advantageous for maintaining extremely small grain size. Such low temperature or absence of anneal can result in a blank having an average grain size of less than about 1 micron.

Alternatively, the blank can be subjected to a temperature equal to or exceeding the minimum temperature to induce recrystallization for a time sufficient to form a final grain distribution within the blank. Although static recrystallization can increase the grain size, the increase can be minimized by conducting the anneal close to the minimum temperature for recrystallization for a minimum time to produce the desired amount of recrystallization (partial or full recrystallization). For copper alloys, the recrystallization annealing can preferably conducted at a temperature of from about 350° C. to about 500° C. for a time period of from about 1 hour to about 8 hours. For high purity copper, the recrystallization annealing is preferably conducted at a temperature of from about 225° C. to about 300° C. for a time period of from about 1 hour to about 4 hours.

Figure 5:
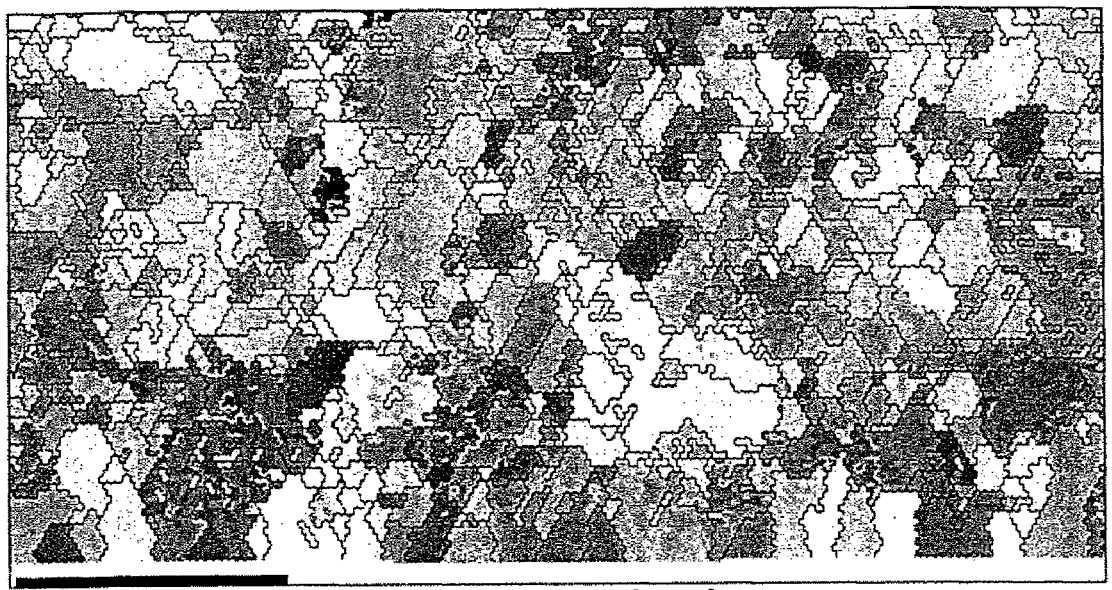
FIG. 5 is an image EBSD/SEM map of grain size distribution and texture for a 99.9999% copper material (6N) after equal channel angular extrusion and subsequent annealing at 250° C. for 5 hours according to one aspect of the invention.
Figure 6:
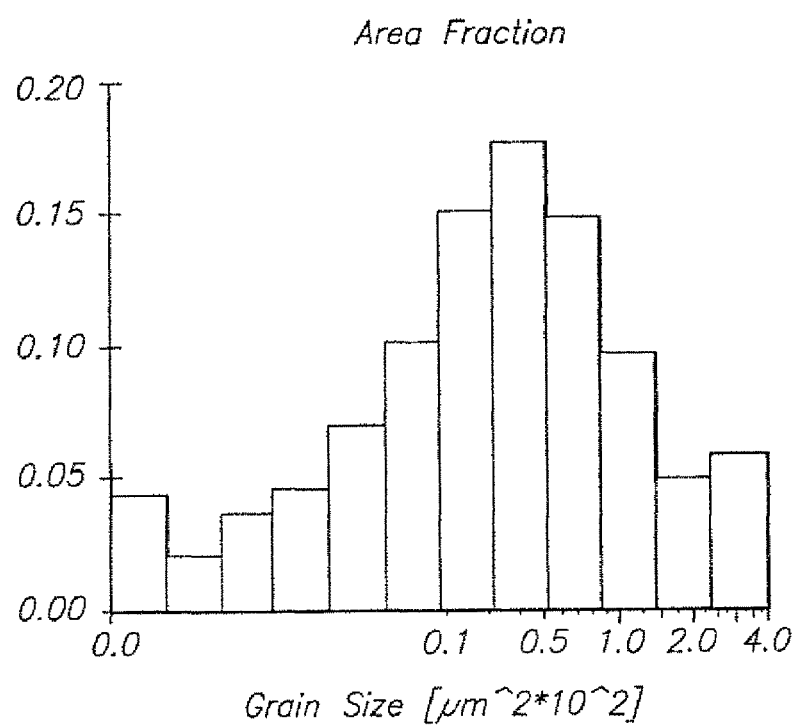
FIG. 6 shows the grain area distribution for the material imaged in FIG. 5. The average grain size of the material is about 6 microns.
Figure 7:
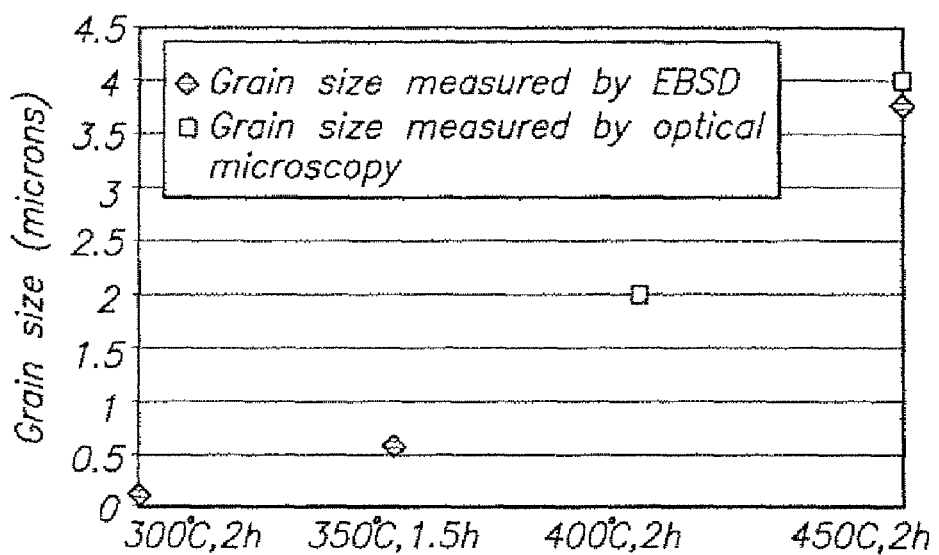
FIG. 7 shows the resulting average grain size as a function of annealing treatment as measured by EBSD and optical microscopy. The annealing treatments were performed on a copper material containing copper alloyed with 0.53 weight % Mg which had been subjected to 6 passes of equal channel angular extrusion through route D.
Figure 8:
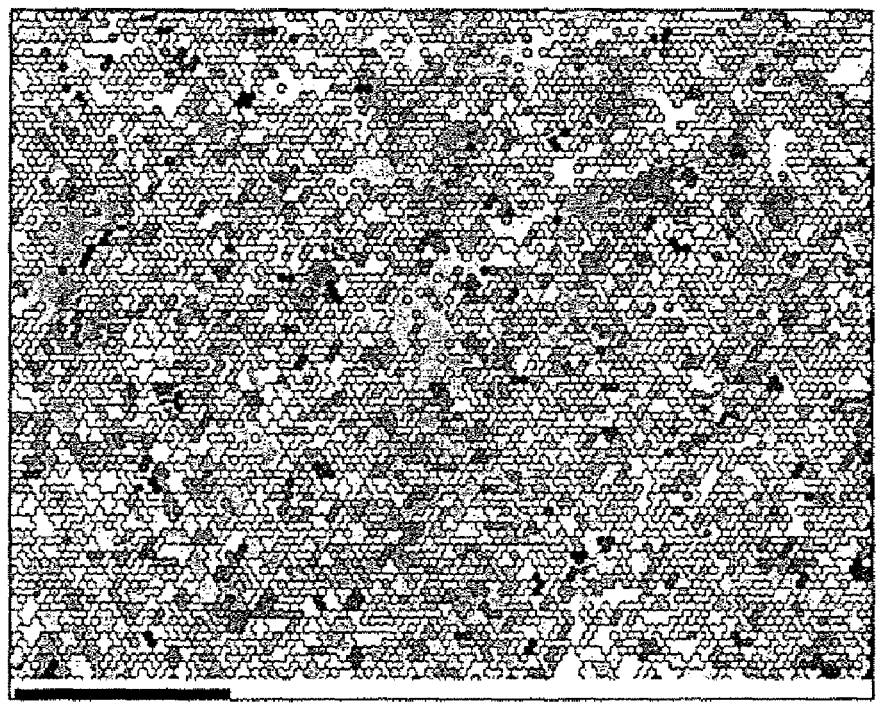
FIG. 8 shows the EBSD/SEM map of the Cu 0.53 wt % Mg ECAE material of FIG. 7 after annealing at 300° C. for 2 hours.
Figure 9:
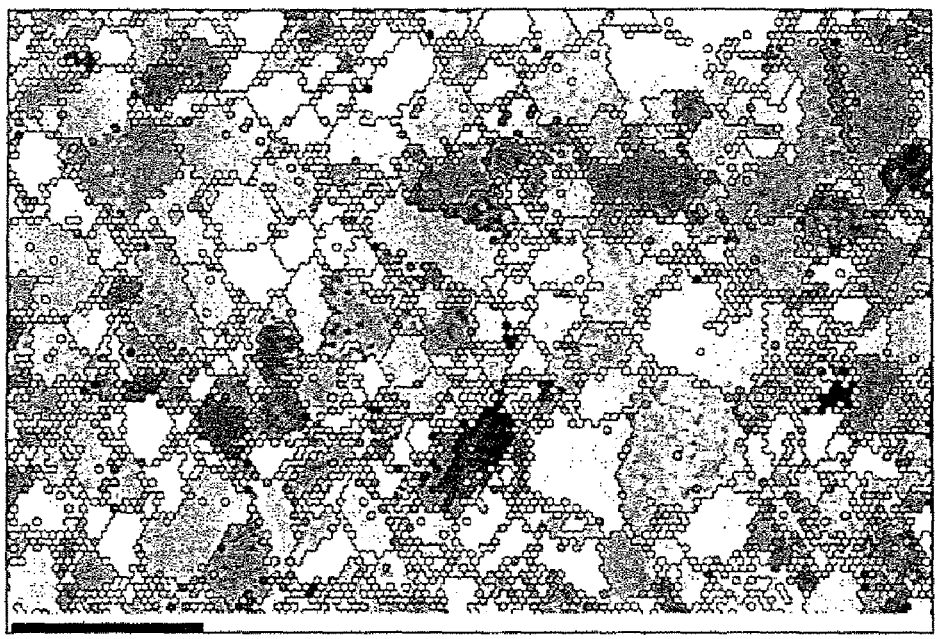
FIG. 9 is an EBSD/SEM map of the grain structure of the Cu 0.53 wt % Mg material of FIG. 7 after annealing at 450° C. for 1.5 hours.
Figure 10:
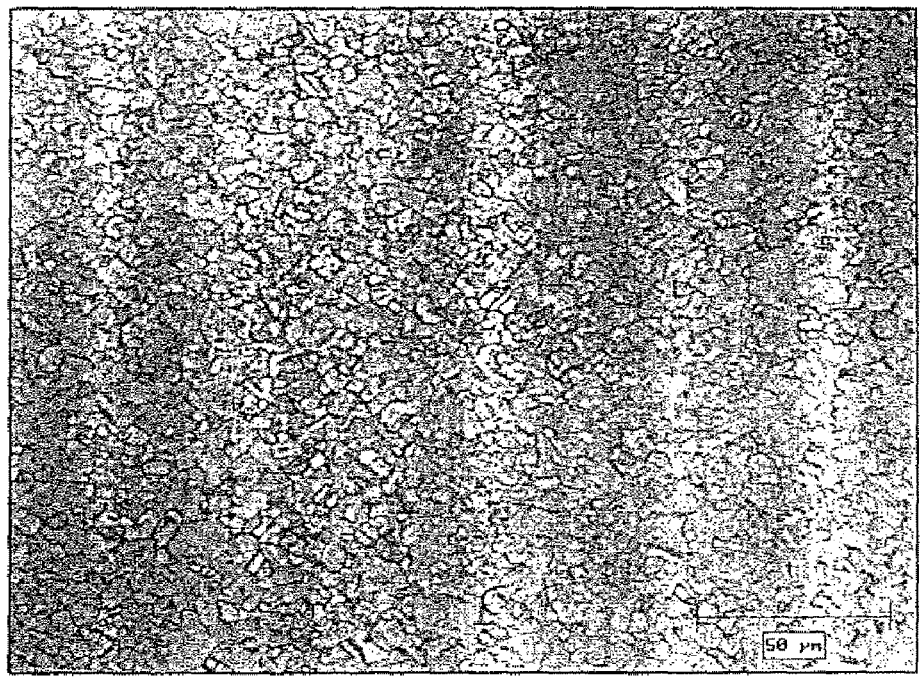
FIG. 10 shows an image of the FIG. 9 material obtained utilizing optical microscopy.

FIGS. 5 and 6 show the grain size and distribution for 6N copper having an average grain size of about 6 microns produced using ECAE and subsequent annealing at 250° C. for 5 hours in accordance with methodology of the invention. FIG. 7 shows the evolution of grain size as a function of anneal treatment for copper alloyed with 0.53% Mg which has been subjected to six passes of ECAE through route D prior to the anneal. FIG. 8 shows the grain size and distribution for the copper/0.53% Mg alloy of FIG. 7 after annealing at 300° C. for 2 hours. FIGS. 9 and 10 show the grain size and distribution for the copper/0.53% Mg alloy of FIG. 7 after annealing at 450° C. for 1.5 hours, analyzed using EBSD/SEM (FIG. 9) and by optical microscopy (FIG. 10).

It is to be noted that the blanks produced in alternate step 310, 320 or 330 can be subjected to an aging treatment (not shown) either in an absence of heat treatment step 400, or after heat treatment 400. Where aging is utilized, the aging can preferably be performed at a temperature less than about 500° C. As indicated above it can be advantageous to perform an aging step to increase the strength of the copper or copper alloy blank by inducing fine precipitates having an average precipitate size of less than about 0.5 microns.

The high-purity copper or copper alloy blank produced by methods of the present invention can be subjected to final target formation 500 to produce a monolithic target or alternatively to produce a bonded target (where "bonded target" refers to a sputtering target bonded to a support such as a backing plate).

Where the final target formed in process 500 will be a monolithic target, final target formation can comprise, for example, machining of the blank to produce the desired target shape. Where a target produced by methodology of the invention will be utilized for semiconductor wafer processing, final formation step 500 can comprise production of a target which has a size appropriate for processing of 200 mm wafers or for processing of 300 mm wafers. An exemplary monolithic copper or copper or copper alloy target in accordance with the invention which can be utilized for example, for processing of a 200 mm semiconductive wafer can have a 13.7 inch sputtering surface diameter, a 16.6 inch opposing surface (backside) diameter, and a thickness of about 0.89 inches. A corresponding target which can be utilized for processing of 300 mm wafers can have a 17.5 inch sputtering surface diameter, a 20.7 inch backside diameter, and a thickness of about 1.0 inch. The monolithic targets formed by methodology of the present invention can preferably be planar targets although other target shapes are contemplated as well as alternative sizes.

Monolithic targets produce in accordance with methodology of the invention can preferably have grain sizes of less than or equal to about 50 microns in order to maximize target strength. Monolithic targets of the invention having submicron grain size can have a yield strength, ultimate tensile strength (UTS) and hardness at least about 50% greater than targets having a substantially identical composition with an average grain size of 30 microns. Monolithic copper targets produced according to the invention which have an average grain size of from 1 to less than about 20 microns can have a strength enhancement of at least 10% over conventional copper targets. For extremely large monolithic targets or in applications where maximum target strength is desired, a monolithic target can preferably be produced in an absence of heat treatment step 400. Accordingly, the resulting monolithic target can retain the small grain size produced in the preceding processing. For example, where a submicron grain size is produced utilizing rolling and or ECAE, the submicron grain size can be maintained in the final monolithic target to maximize the target strength. In an alternative aspect, heat treatment step 400 can be utilized during processing to produce the monolithic target which can produce a final grain distribution resulting in an average grain size of from about 1 micron to about 20 microns in the resulting monolithic target.

Where the target produced in step 500 will be a bonded target, the target formation can comprise a bonding step in addition to any machining that is performed to form the desired target shape. The bonding process can involve bonding the blank formed by the previous processing methods to a support such as a backing plate. Exemplary backing plates can comprise, for example, aluminum and/or copper. Exemplary backing plate materials are CuCr, Al 2024 and Al 6061 T4. The bonding process can comprise one or more of hipping, rolling, cladding, soldering, explosive bonding, frictionless forging, diffusion bonding, or alternative methods known to those skilled in the art. The bonding can produce a bond having a yield strength of at least about 10 ksi. In particular instances, the bonding produces a bond strength greater than or equal to about 15 ksi and in specific applications, produces a bond strength equal to or exceeding 30 ksi.

The various processing methods described above can be utilized to produce copper articles having extremely uniform and small grain sizes. Often, the grain sizes produced can average from submicron grains to about. This small grain size allows very high bonding strength to be obtained since high temperature bonding methods can be utilized. Where a bonded target will be produced, heating (heat treatment 400) can be combined with the bonding in the target formation process.

Bonding of high-purity copper targets according to methods of the invention can preferably be conducted at a temperature of less than or equal to about 325° C. for a time of less than or equal to about 4 hours to minimize grain growth in the target. Although some grain growth may occur during high temperature bonding processes, the initial extremely fine grain size allows some grain growth to occur without resulting in the larger grain sizes observed in targets formed utilizing conventional processing methods. A resulting grain size of from 1 to about 20 microns in the final bonded targets of the invention allow strength enhancement of at least 10% over conventional copper targets.

Formation of bonded copper alloy targets can preferably be conducted at a temperature and time less than those that produce full static recrystallization. Such bonding can preferably comprise conducting bonding at temperature of less than about 400° C. for 4 hours and more preferably less than 350° C. for 1-4 hours. Utilizing these bonding conditions, the copper alloy target can be formed to have an average grain size of less than 1 micron.

Alternatively, bonding can comprise a temperature which can result in recrystallization of the copper alloy. During bonding that comprises temperatures above the minimum temperature of static recrystallization for the specific alloy, it can be desirable to minimize the temperature and time of bonding to thereby minimize grain growth. Recrystallization that occurs during bonding can preferably be such that the resulting average grain size produced in the copper alloy is from 1 to about 20 microns. Such heat treatment for full recrystallization can preferably be conducted at a temperature of from about 200° C. for at least about 1 hour and preferably between 350° C. and 500° C. for a time of greater than 1 hour.

As an alternative to combining the heating and bonding processes, a heat treating can be conducted either prior to the bonding step (i.e. heat treatment 400) or subsequent to the bonding step. It can be advantageous to combine bonding and heat treatment to enhance bond strength and recrystallize the copper or copper alloy material.

The bonded copper and bonded copper alloy targets formed in accordance with the methodology of the invention can have increased bond strength relative to bonded targets formed utilizing conventional methods. Diffusion bonding can be preferred for bonding targets to backing plates in some aspects of the invention. Where the grain size of the target blank is submicron, a very high strength diffusion bond can be produced due to enhanced diffusivity of the ultrafine grains. The resulting diffusion bond can have a yield strength of 15 ksi or above, which in some instances can equal or exceed 30 ksi. Additional advantages of bonded copper and copper alloy targets of the invention relative to conventional targets include improved resistance to target warping, reduced arcing. Utilization of the targets of the invention for sputtering applications can provide an improved quality of film having fewer particles incorporated therein and can provide better uniformity of film thickness and therefore an improved resistance uniformity. Additionally, utilization of targets formed in accordance with methodology of the invention for semiconductor processing provides improved wafer to wafer uniformity of film thickness and resistance.

Monolithic high-purity copper and copper alloy targets formed in accordance with methodology of the Invention can have a lifetime which is at least 30% longer and typically 40% longer relative to conventional bonded copper and copper alloy targets formed utilizing alternative methodologies. The ability to achieve monolithic copper targets allows avoidance of debonding (separation from the backing plate) that can occur with conventional bonded targets. The monolithic targets according to the invention additionally have increased resistance to target warping, reduction of arcing, reduced particle generation in thin films sputtered from such targets, enhanced uniformity of film thickness and resistivity. Additionally, monolithic targets in accordance with the invention have improved wafer to wafer consistency of film thickness and uniformity of resistivity.

The examples presented below are exemplary preferred embodiments of the invention. It is to be understood that the invention contemplates additional embodiments and is not intended to be limited to the specific examples presented.

Example 1

Production of High-Purity Copper Monolithic Sputtering Targets

An as-cast copper billet of 6N purity having a 6 inch diameter and a length of 11 inches, is heated and maintained at a temperature of about 990° F. for about 60 minutes in an air oven. The billet is then hot forged, utilizing silica or graphite foil during forging, to a final height reduction of from 55-75% and is immediately water quenched. The forged block is then cold-rolled using 16 passes, quenching after an initial 8 passes, with a total reduction of from about 60% to about 80%. Cracking is prevented during the cold-rolling by conducting each of the initial four passes to produce a reduction of from about 5% to about 6% per pass. Passes 13-16 are conducted to produce from about 10% to about 11% reduction per pass to achieve a small grain size. After cold-rolling, the blank is recrystallized by heating to about 480° F. for about 120 minutes. The blank is machined to produce the final target. The resulting high-purity copper monolithic target has an average grain size of less than 50 microns with a uniform grain distribution throughout the target.

Figure 11:
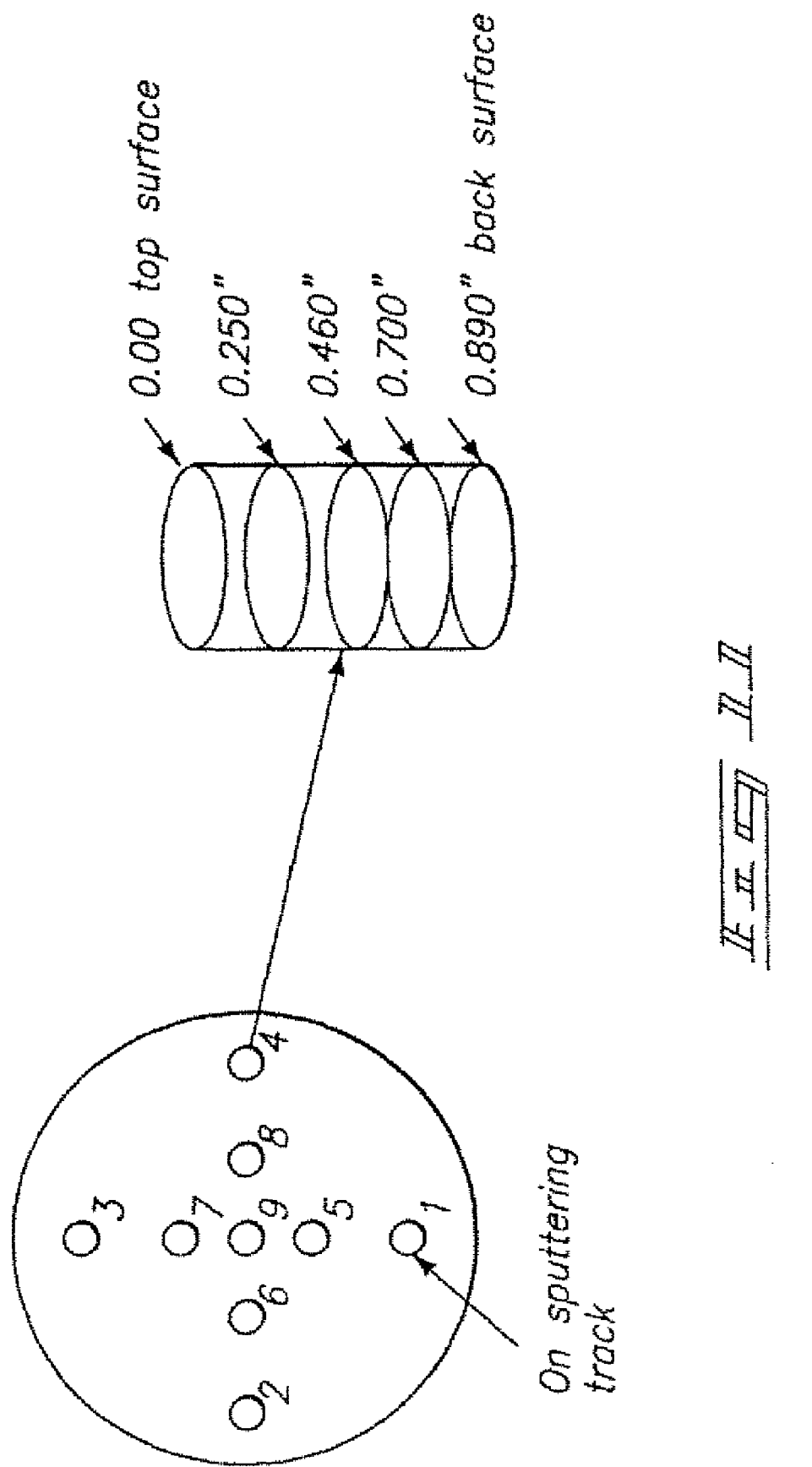
FIG. 11 is a diagram depicting sampling of a target for grain size and texture measurement according to one aspect of the invention.

FIG. 11 illustrates sampling locations utilized for analysis of the resulting monolithic target. The target has a thickness of 0.89 inches. The grain size measured at each point indicated at the sputtering surface, and the average thereof is given in Table 2.

TABLE 2

Grain size measurements at target surface

| Location | 1 | 2 | 3 | 4 | 5 | 6 | 7 | 8 | 9 | Ave |
|---|---|---|---|---|---|---|---|---|---|---|
| Grain size | 38 | 45 | 45 | 38 | 38 | 53 | 38 | 38 | 53 | 43 |

The grain size measured for the indicated point of the depth planes of FIG. 11 are given in Table 3, along with the average of such measured values. Table 4 indicates the texture determined for the indicated target points identified in FIG. 11.

TABLE 3

Grain size measurements at indicated points within the target

| Depth | 2 | 4 | 5 | 7 | Ave |
|---|---|---|---|---|---|
| 0.250" | 53 | 38 | 45 | 45 | 45.3 |
| 0.460" | 45 | 38 | 45 | 45 | 43.3 |
| 0.700" | 45 | 45 | 45 | 45 | 45 |

TABLE 4

Texture of target microstructure at indicated points

| Depth | Location | (111) | (200) | (220) | (113) |
|---|---|---|---|---|---|
| 0.00" | 2 | 24.0% | 20.9% | 25.0% | 30.1% |
| | 4 | 23.9% | 22.3% | 23.7% | 30.1% |
| | 5 | 21.5% | 20.6% | 26.2% | 31.7% |
| | 7 | 23.5% | 20.5% | 24.2% | 31.7% |
| 0.250" | 2 | 22.5% | 16.9% | 30.8% | 29.7% |
| | 4 | 24.6% | 16.7% | 28.7% | 30.2% |
| | 5 | 18.0% | 15.2% | 39.4% | 27.5% |
| | 7 | 24.5% | 15.2% | 31.2% | 28.0% |
| 0.460" | 2 | 21.5% | 17.6% | 35.1% | 25.8% |
| | 4 | 19.0% | 17.6% | 42.4% | 21.0% |
| | 5 | 16.8% | 15.9% | 41.2% | 26.2% |
| | 7 | 20.5% | 17.2% | 33.1% | 29.3% |
| 0.700" | 2 | 21.9% | 20.5% | 26.0% | 31.6% |
| | 4 | 23.0% | 20.8% | 25.8% | 30.4% |
| | 5 | 22.2% | 20.8% | 27.2% | 29.8% |
| | 7 | 22.4% | 22.4% | 21.1% | 34.0% |

An additional example of a high-purity target is formed as indicated in the preceding example with the exception that ECAE is included in the processing. The ECAE is performed prior to the cold-rolling to reduce the grain size from that present in the as-cast billet. The resulting target is analyzed as indicated above for the previous example. The target had an average grain size of less than 15 microns throughout the target.

Example 2

Production of Copper Alloy Monolithic Sputtering Targets

Copper alloy billets having less than 10% of Ag, Sn, Al, or Ti are heated and maintained at a temperature of about 900° F. to about 1500° F. for about 45 minutes. The billets are then hot forged to produce a final reduction of at least about 50%. Some of forged billets (depending on the alloy) are reheated for at least 10 minutes during the forging. After the final forging, the forged billets are immediately water quenched. The forged blocks are cold-rolled to a reduction of at least about 60% to form a blank which is recrystallized by heating to a temperature of from about 750° F. to about 1200° F. for 120 minutes. The recrystallized blanks are machined to form monolithic targets. Each of the targets has an average grain size of from about 15 microns to about 50 microns.

A specific target having copper alloyed with 0.3 atomic % Al was formed from a billet having a six inch diameter and a length of 11 inches. The billet was initially heated for 1 hour at 1400° F. and was initially forged to a height of 6 inches. After the initial forging, the billet was reheated for 15 minutes at 1400° F. and was subsequently forged to a height of 3 inches. After final forging, the forged block was immediately water quenched. Cold rolling consisting of 17 passes was then conducted according to the rolling plan shown in Table 5 to form a rolled blank.

After rolling the blank was annealed at about 825° F. for about 120 minutes and formed into the final monolithic target. Analysis of the target surface (in accordance with the surface points shown in FIG. 11) revealed a homogenous composition and an average grain size of 37 microns. The grain size non-uniformity was 8.6% (1-sigma).

TABLE 5

Rolling Plan for Cu-0.3 at % Al

| Pass | Direction (degree) | Δ Height (inches) | Height (inches) | % Reduction |
|---|---|---|---|---|
| 1 | 0 | 0.1 | 2.9 | 3.3 |
| 2 | 135 | 0.1 | 2.8 | 3.4 |
| 3 | 270 | 0.1 | 2.7 | 2.6 |
| 4 | 45 | 0.1 | 2.6 | 3.7 |
| 5 | 180 | 0.1 | 2.5 | 3.8 |
| 6 | 315 | 0.1 | 2.4 | 4.0 |
| 7 | 90 | 0.1 | 2.3 | 4.2 |
| 8 | 225 | 0.1 | 2.2 | 4.3 |
| 9 | 0 | 0.13 | 2.07 | 5.9 |
| 10 | 135 | 0.13 | 1.94 | 6.2 |
| 11 | 270 | 0.13 | 1.81 | 6.7 |
| 12 | 45 | 0.13 | 1.68 | 7.1 |
| 13 | 180 | 0.13 | 1.55 | 7.7 |
| 14 | 315 | 0.13 | 1.42 | 8.3 |
| 15 | 90 | 0.13 | 1.29 | 9.1 |
| 16 | 225 | 0.13 | 1.16 | 10.0 |
| 17 | | | One free pass | |

Example 3

Production of Copper Alloy Diffusion Bonded Sputtering Targets

Copper alloy billets are provided and processed as described in example 2 with the exception that the cold-rolling was conducted to a reduction of at least about 50%. The cold-rolled blanks are bonded to CuCr backing plates at a bonding temperature of about 450° C. for about 120 minutes. Recrystallization of the alloy occurs during the bonding. The bonded targets have a grain size of less than about 30 microns and a bond strength of up to about 30 ksi.

Example 4

Production of High-Purity Copper Sputtering Targets Utilizing ECAE

Copper billets of cast copper having a purity of at least 99.9999% are provided. The high-purity copper billets are hot-forged at a temperature of least about 500° C. with a reduction in height of at least about 40% to form forged blocks. The forged blocks are solutionized by heating the blocks to a temperature of at least about 500° C. which is maintained for at least about 1 hour. The solutionized blocks are water quenched immediately after the heat treatment and are extruded utilizing from four to six passes of equal channel angular extrusion (ECAE) in accordance with route D (90 degree rotation of the blocks between successive passes) to produce a sub-micron microstructure. Intermediate annealing at a temperature of from about 125° C. to about 225° C., and for a time of at least about 1 hour is performed between some or all of the ECAE passes. The extruded high-purity copper blocks are cold-rolled to a reduction of at least 60% to form target blanks which are formed into either monolithic or bonded targets.

The blanks for monolithic targets are machined to produce the final target. Direct machining of the blanks produces targets having submicron grain size. Recrystallization is performed to produce monolithic targets having an average grain size of from 1 micron to about 20 microns.

The blanks for bonded targets are diffusion bonded to a backing plate. Diffusion bonding is conducted at a temperature below 350° C. for less than 4 hours. The bond yield strength is greater than about 15 ksi. The bonded targets have grain sizes of from submicron to about 20 microns. The submicron targets have a strength enhancement of about 50% relative to conventional targets. The bonded targets having a grain size of from 1 to about 20 microns have a strength enhancement of at least 10% relative to conventional copper targets. The grain size at various locations (see FIG. 11 for sampling information) throughout the 6N copper target after diffusion bonding at 250° C. for 2 hours is shown in Table 6. The average grain size is 11.37 microns with a standard deviation of 6.97% (1-sigma).

TABLE 6

Grain size (μm) for the 6N diffusion bonded target

| Location | Top Plane | Middle Plane | Bottom plane |
|---|---|---|---|
| 1 | 13 | 11 | 11 |
| 2 | 11 | 13 | 11 |
| 3 | 11 | 11 | 11 |
| 4 | 13 | 11 | 11 |
| 5 | 11 | 11 | 11 |
| 6 | 11 | 11 | 13 |
| 7 | 11 | 11 | 13 |
| 8 | 11 | 11 | 11 |
| 9 | 11 | 11 | 11 |

Table 7 gives the three-point hardness measurements obtained from the top surface and bottom surface of the target of Table 6. The average hardness is 53.3 HB with a standard deviation of 2.18% (1-sigma).

TABLE 7

Hardness (HB) of the 6N diffusion bonded target

| Location | Top Plane | Bottom Plane |
|---|---|---|
| 1 | 53.4/55.1/53.4 | 51.8/51.8/50.3 |
| 2 | 50.3/51.8/51.8 | 53.4/53.4/51.8 |
| 3 | 53.4/55.1/51.8 | 53.4/53.4/53.4 |
| 4 | 53.4/55.1/53.4 | 50.3/51.8/51.8 |
| 5 | 55.1/55.1/53.4 | 51.8/51.8/51.8 |
| 6 | 53.4/55.1/53.4 | 51.8/53.4/50.3 |
| 7 | 55.1/55.1/53.4 | 53.4/53.4/51.8 |
| 8 | 53.4/53.4/51.8 | 51.8/53.4/51.8 |
| 9 | 53.4/53.4/51.8 | 53.4/53.4/51.8 |

Example 5

Production of Copper Alloy Sputtering Targets Utilizing ECAE

Copper billets containing copper alloyed with from 1000 ppm to less than or equal to about 10% of Ag, Al, In, Zn, B, Ga, Mg, Sn, Ge, Ti or Zr are provided. The billets are hot forged at a temperature of at least about 500° C. with a reduction of height of at least about 40% to form a forged blocks. The forged blocks are solutionized by heating the forged blocks to a temperature of at least about 500° C. and maintaining the temperature for at least about 1 hour to form a solutionized block. The solutionized blocks are water quenched immediately after solutionizing.

The solutionized blocks are extruded by performing from four to six passes of ECAE. The solutionized blocks are rotated 90 degrees between each of the passes in accordance with route D. Intermediate annealing is conducted for at least one hour at a temperature of from about 150° C. to about 325° C. between some passes through ECAE. The ECAE extruded blocks are cold-rolled to a reduction of at least about 60% to form a copper alloy blank.

A first monolithic copper alloy target is produced by machining a copper alloy blank produced as described to form a monolithic target. The first monolithic target has an average grain size of less than 1 micron. Additionally, the first monolithic copper alloy target has a yield strength, ultimate tensile strength (UTS) and hardness at least about 50% greater than a target having a substantially identical elemental composition with an average grain size of 30 micron.

A second monolithic copper alloy target is produced by heat-treating a copper alloy blank produced as described above. The heat treatment is conducted at a temperature of 350° C. for about 1 hour. The second target has an average grain size of from 1 micron to about 20 microns, has a substantial absence of precipitates (where substantial absence of precipitates refers to an absence of detectable precipitates), and has an absence of detectable segregation and a maximum void size of less than 1 micron.

A first bonded copper alloy target is produced by diffusion bonding a copper alloy blank produced as described, to a backing plate. The diffusion bonding is conducted at a temperature of less than 350° C. for from one to four hours. The first bonded alloy target has an average grain size of less than 1 micron.

A second bonded copper alloy target is produced by diffusion bonding a copper alloy blank produced as described above to a backing plate at a bonding temperature of from about 350° C. to about 500° C. for at least one hour. The second bonded copper alloy target is fully recrystallized and has an average grain size of from about 1 micron to about 20 microns.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a copper-comprising sputtering target, comprising:
   providing a Cu billet having a purity of at least 99.99% copper;
   hot-forging the Cu billet at a temperature of greater than 300° C. with a reduction in height of at least about 40% to form a forged block;
   water quenching the forged block;
   performing an extrusion process comprising:
   at least four passes of the forged block through equal channel angular extrusion (ECAE); and
   a heat-treatment comprising one or both of intermediate annealing between at least some of the at least four passes, and heating ECAE die to a temperature of from about 125° C. to about 225° C. during the extrusion process;
   after extrusion process, cold-rolling to a reduction of less than 90% to form a blank; and
   forming the blank into a target.

2. The method of claim 1 further comprising solutionizing the forged block prior to water quenching, the solutionizing comprising heating the forged block to a temperature of at least about 500° C. and maintaining the temperature for at least about 60 minutes.

3. The method of claim 1 wherein the extrusion process comprises intermediate annealing at a temperature of from about 125° C. to about 225° C. for greater than about 1 hour.

4. The method of claim 1 further comprising heating the blank to recrystallize the copper and form a final grain distribution within the blank, the final grain distribution having an average grain size of from about 1 to about 20 microns; wherein the forming the blank into a target forms a monolithic target.

5. The method of claim 1 wherein the forming the blank into a target comprises forming a bonded target.

6. The method of claim 5 wherein the forming the bonded target comprises bonding the target to a backing plate, the bonding being conducted at a temperature of less than or equal to about 325° C. for a time of less than about 4 hours, the bonding comprising at least one of hipping, roll cladding, soldering and diffusion bonding.

7. The method of claim 6 wherein the bonding comprises diffusion bonding to form a bond having a bond yield strength of from at least about 10 ksi to about 15 ksi.

8. The method of claim 1 wherein the average grain size is from 1 micron to about 50 microns.

9. The method of claim 8 wherein the average grain size is from 5 microns to about 20 microns.

10. The method of claim 1 wherein a uniform grain size distribution exists throughout an entirety of the blank, the uniform grain size having a standard deviation of less than 15% (1-sigma).

11. The method of claim 10 wherein the grain size uniformity standard deviation is less than about 10% (1-sigma).

12. The method of claim 1 wherein the Cu billet has a purity of at least about 99.999% copper.

13. The method of claim 1 wherein the Cu billet has a purity of at least about 99.9999% copper.

14. The method of claim 1 wherein the Cu billet has a purity of at least about 99.99995% copper.

15. The method of claim 1 wherein the at least four passes consists of from four to six passes.

16. A method of forming a copper alloy sputtering target, comprising:
   providing a Cu billet consisting essentially of less than 99.99% copper and at least one alloying element selected from the group consisting of Cd, Ca, Au, Ag, Be, Li, Mg, Al, Pd, Hg, Ni, in, Zn, B, Ga, Mn, Sn, Ge, W, Cr, O, Sb, Ir, P, As, Co, Te, Fe, S, Ti, Zr, Sc, and Hf, a total amount of the at least one alloying element present in the Cu billet being at least 100 ppm and less than 10% by weight; hot-forging the Cu billet at a temperature of greater than 300° C. with a reduction in height of at least about 40% to form a forged block; performing an extrusion process comprising:
   at least four passes of the forged block through equal channel angular extrusion (ECAE); and
   a heat-treatment comprising one or both of heating ECAE die during the extrusion process, and intermediate annealing at a temperature of from about 120° C. to about 325° C., for a time of at least 1 hour between at least some of the at least four passes;

after the extrusion process, cold-rolling to a reduction of less than about 90% to form a blank; and forming the blank into a target.

17. The method of claim 16 wherein the extrusion process comprises heating the ECAE die to a temperature of from about 125° C. to about 325° C.

18. The method of claim 16 further comprising solutionizing forged block by heating to a temperature of at least about 500° C. and maintaining the temperature for at least about 60 minutes prior to the extrusion process.

19. The method of claim 16 wherein the at least four passes consists of from four to six passes.

20. The method of claim 16 wherein during and after the extruding process the method utilizes only temperatures less than or equal to 350° C., and wherein the forming the blank into a target comprises forming a monolithic target.

21. The method of claim 16 wherein the forming the blank into a target comprises forming a bonded target.

22. The method of claim 21 further comprising performing a full static recrystallization treatment conducted at a temperature of from about 250° C. to about 500° C. for a time of from about 1 hour to about 8 hours, prior to the forming the bonded target.

23. The method of claim 21 further comprising performing a full static recrystallization treatment conducted at a temperature of from about 250° C. to about 500° C. for a time of from about 1 hour to about 8 hours after the forming the bonded target.

24. The method of claim 21 wherein the forming the bonded target comprises bonding the target to a backing plate, the bonding being conducted at a temperature of less than or equal to about 500° C. for a time of less than or equal to about 4 hours, the bonding comprising at least one of hipping, roll cladding, soldering, explosive bonding, frictionless forging and diffusion bonding.

25. The method of claim 21 wherein the bonding comprises diffusion bonding to form a bond having a bond yield strength of from at least about 10 ksi to about 15 ksi.

26. The method of claim 16 wherein the average grain size is from 1 micron to about 20 microns.

27. The method of claim 26 wherein the average grain size is from about 5 microns to about 10 microns.

28. The method of claim 16 wherein the average grain size is less than 1 micron.

29. The method of claim 16 wherein a uniform grain size distribution exists throughout an entirety of the blank, the uniform grain size having a standard deviation of less than 15% (1-sigma).

30. The method of claim 29 wherein the grain size uniformity standard deviation is less than about 10% (1-sigma).

31. The method of claim 16 further comprising, prior to the extruding process, performing an aging treatment at a temperature of less than about 500° C. to form precipitates having an average precipitate size of less than or equal to about 0.5 micron.

* * * * *